United States Patent
Park et al.

(10) Patent No.: US 8,039,829 B2
(45) Date of Patent: Oct. 18, 2011

(54) CONTACT STRUCTURE, A SEMICONDUCTOR DEVICE EMPLOYING THE SAME, AND METHODS OF MANUFACTURING THE SAME

(75) Inventors: Jeong-Hee Park, Hwaseong-si (KR); Yong-Ho Ha, Hwaseong-si (KR); Hyeong-Geun An, Hwaseong-si (KR); Joon-Sang Park, Seoul (KR); Hyun-Suk Kwon, Seoul (KR); Myung-Jin Kang, Suwon-si (KR); Doo-Hwan Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 210 days.

(21) Appl. No.: 12/412,657

(22) Filed: Mar. 27, 2009

(65) Prior Publication Data
US 2009/0243117 A1 Oct. 1, 2009

(30) Foreign Application Priority Data

Mar. 28, 2008 (KR) .......................... 10-2008-0029249

(51) Int. Cl.
 *H01L 47/00* (2006.01)
(52) U.S. Cl. ..................................... 257/4; 257/E21.209
(58) Field of Classification Search ........ 257/4, E21.209
See application file for complete search history.

(56) References Cited

U.S. PATENT DOCUMENTS

| 6,511,862 B2* | 1/2003 | Hudgens et al. ................. 438/95 |
| 7,105,396 B2* | 9/2006 | Hwang et al. .................. 438/198 |
| 7,394,088 B2* | 7/2008 | Lung .................................. 257/2 |
| 2006/0237756 A1* | 10/2006 | Park et al. ..................... 257/296 |
| 2007/0249090 A1 | 10/2007 | Philipp et al. |
| 2009/0035514 A1* | 2/2009 | Kang et al. ..................... 428/131 |

FOREIGN PATENT DOCUMENTS

| KR | 1020000038672 | 7/2000 |
| KR | 1020010016930 | 3/2001 |
| KR | 1020010083588 | 9/2001 |
| KR | 1020030052628 | 6/2003 |
| KR | 1020040038421 | 5/2004 |
| KR | 1020060091190 | 8/2006 |
| KR | 1020060110559 | 10/2006 |

OTHER PUBLICATIONS

Korean Office Action issued Aug. 28, 2009 in corresponding Korean Patent Appln No. 10-2008-0029249.

* cited by examiner

*Primary Examiner* — David Zarneke
*Assistant Examiner* — Jenny L. Wagner
(74) *Attorney, Agent, or Firm* — F. Chau & Associates, LLC

(57) ABSTRACT

A contact structure that includes a first pattern formed on a substrate, wherein the first pattern has a recessed region in an upper surface thereof, a planarized buffer pattern formed on the first pattern, and a conductive pattern formed on the planarized buffer pattern.

13 Claims, 7 Drawing Sheets

CONTACT STRUCTURE, A SEMICONDUCTOR DEVICE EMPLOYING THE SAME, AND METHODS OF MANUFACTURING THE SAME

CROSS-REFERENCE TO RELATED APPLICATION

This application claims priority to Korean Patent Application No. 10-2008-0029249, filed on Mar. 28, 2008, the disclosure of which is incorporated by reference herein in its entirety.

BACKGROUND

1. Technical Field

The present invention relates to a contact structure, a semiconductor device employing the same, and methods of manufacturing the same.

2. Discussion of the Related Art

Non-volatile memory devices can retain stored information even when not powered. Some examples of non-volatile memory devices include read-only and flash memory devices.

Research has been performed on memory devices with structures that have nonvolatile memory characteristics and increased integration density. This research has led to the development of a phase change memory device.

In a phase change memory device, a contact structure may be formed on a data storage pattern. However, when the data storage pattern has a recessed region in its upper surface, stable contact with the contact structure may not be realized. Accordingly, there is a need to improve the contact characteristics of a data storage pattern having a recessed region in its upper surface.

SUMMARY

According to an exemplary embodiment of the present invention, there is provided a contact structure that includes: a first pattern formed on a substrate, wherein the first pattern has a recessed region in an upper surface thereof; a planarized buffer pattern formed on the first pattern; and a conductive pattern formed on the planarized buffer pattern.

The planarized buffer pattern may include a conductive material.

The recessed region of the first pattern may be filled with the planarized buffer pattern.

The contact structure may further include: an insulating layer formed on the conductive pattern; and a conductive plug passing through the insulating layer, wherein the conductive plug is electrically connected to the conductive pattern.

The conductive pattern may be self-aligned with the first pattern.

According to an exemplary embodiment of the present invention, there is provided a semiconductor device that includes: a data storage pattern formed on a substrate, wherein the data storage pattern has a recessed region in an upper surface thereof; a planarized buffer pattern formed on the data storage pattern; and a conductive pattern formed on the planarized buffer pattern.

The data storage pattern may include a phase change material.

The recessed region of the data storage pattern may be filed with the planarized buffer pattern.

The planarized buffer pattern may include a conductive material.

The data storage pattern and the conductive pattern may be self-aligned.

The semiconductor device may further include: an interlayer insulating layer provided between the data storage pattern and the substrate, wherein the interlayer insulating layer has a hole; and an electrode formed in the hole.

The semiconductor device may further include a molding pattern formed between the data storage pattern and the interlayer insulating layer. Here, the data storage pattern may have a part passing through the molding pattern and electrically connected to the electrode.

The semiconductor device may further include: an intermetal insulating layer formed on the conductive pattern; and a conductive plug passing through the intermetal insulating layer.

According to an exemplary embodiment of the present invention, there is provided a method of manufacturing a semiconductor device that includes: forming a data storage material layer on a substrate, wherein the data storage material layer has a recessed region in an upper surface thereof; forming a buffer layer on the data storage material layer; planarizing the buffer layer; forming a conductive layer on the substrate having the planarized buffer layer; and forming a data storage pattern, a planarized buffer pattern, and a conductive pattern that are sequentially stacked by patterning the conductive layer, the planarized buffer layer, and the data storage material layer.

The data storage material layer may include a phase change material.

The buffer layer may include a conductive material.

The data storage pattern and the conductive pattern may be self-aligned.

The data storage pattern may have a recessed region in an upper surface thereof and the recessed region of the data storage pattern may be filled with the planarized buffer pattern.

The method may further include: before forming the data storage material layer, forming an interlayer insulating layer on the substrate, wherein the interlayer insulating layer has a hole; and forming an electrode in the hole.

The method may further include: before forming the data storage material layer, forming a molding pattern on the interlayer insulating layer, wherein the molding pattern has an opening partially or entirely exposing an upper surface of the electrode.

The method may further include: forming an intermetal insulating layer on the substrate having the data storage pattern, the planarized buffer pattern, and the conductive pattern that are sequentially stacked; and forming a conductive plug passing through the intermetal insulating layer and electrically connected to the conductive pattern

BRIEF DESCRIPTION OF THE DRAWINGS

The above and other features of the present invention will become more apparent by describing in detail exemplary embodiments thereof with reference to the accompanying drawings in which.

DETAILED DESCRIPTION OF EXEMPLARY EMBODIMENTS

Figure 1A:
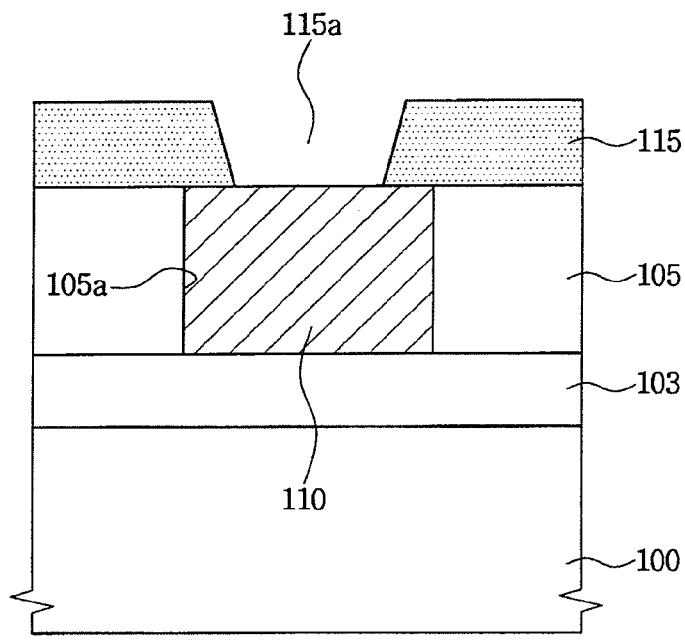
FIGS. 1A to 1F are cross-sectional views of a semiconductor device according to an exemplary embodiment of the present invention.

Exemplary embodiments of the present invention will now be described with reference to the accompanying drawings. This invention may, however, be embodied in many different forms and should not be construed as limited to the embodiments set forth herein.

In the drawings, the thicknesses of layers and regions may be exaggerated for clarity, and like elements are denoted by like reference numerals throughout. When a layer or substrate is described as being on another layer or substrate, it may be directly on the other layer or substrate, or a third layer or substrate may be interposed therebetween. In addition, when a layer or substrate is described as being on another layer or substrate, it may be on the top or on the bottom of the other layer or substrate.

Figure 1B:
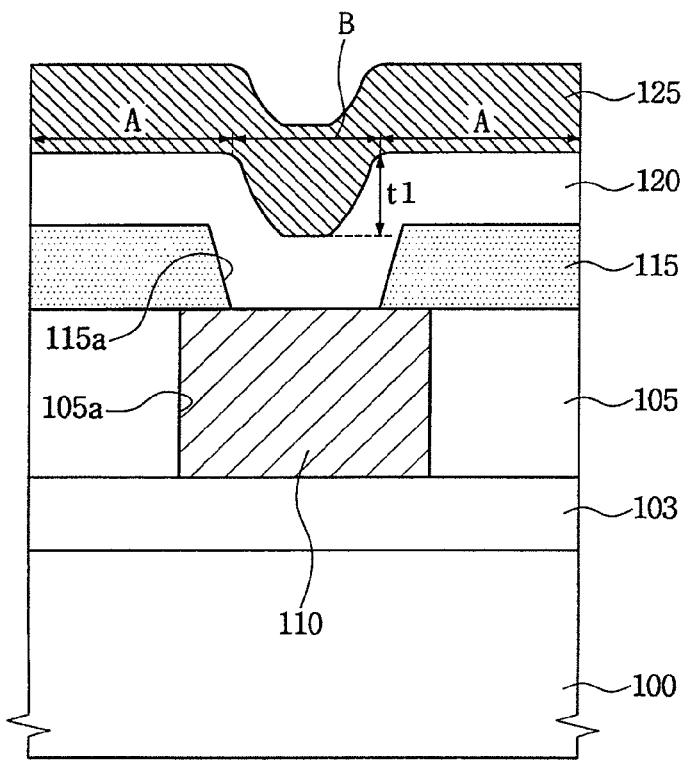
Figure 1C:
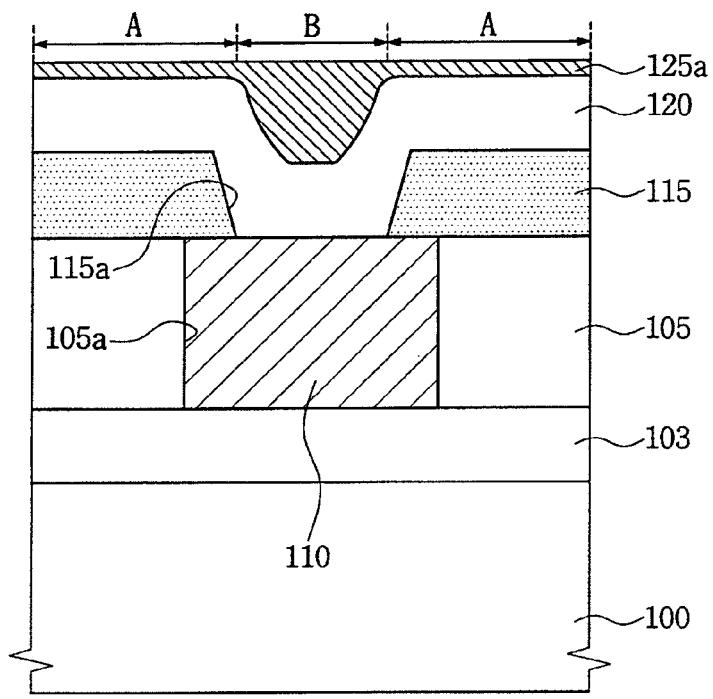
Figure 1D:
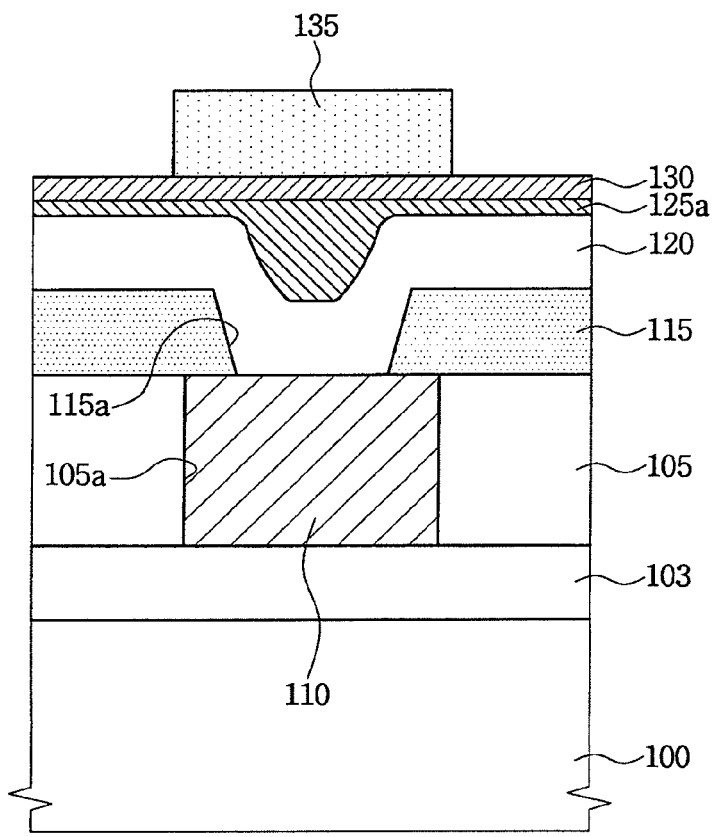
Figure 1E:
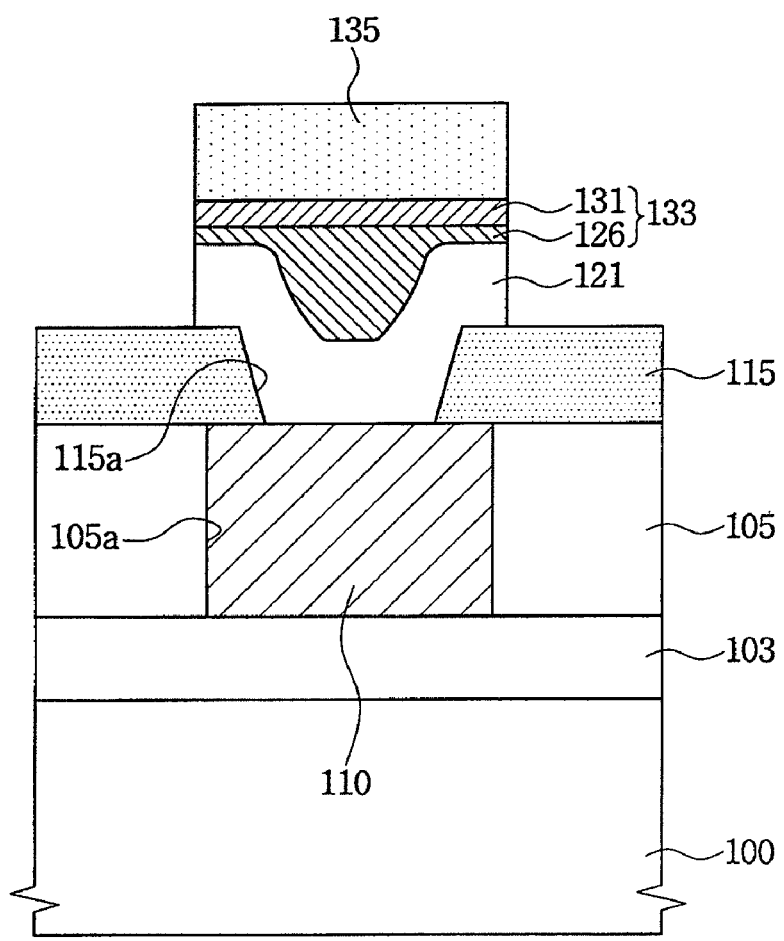
Figure 1F:
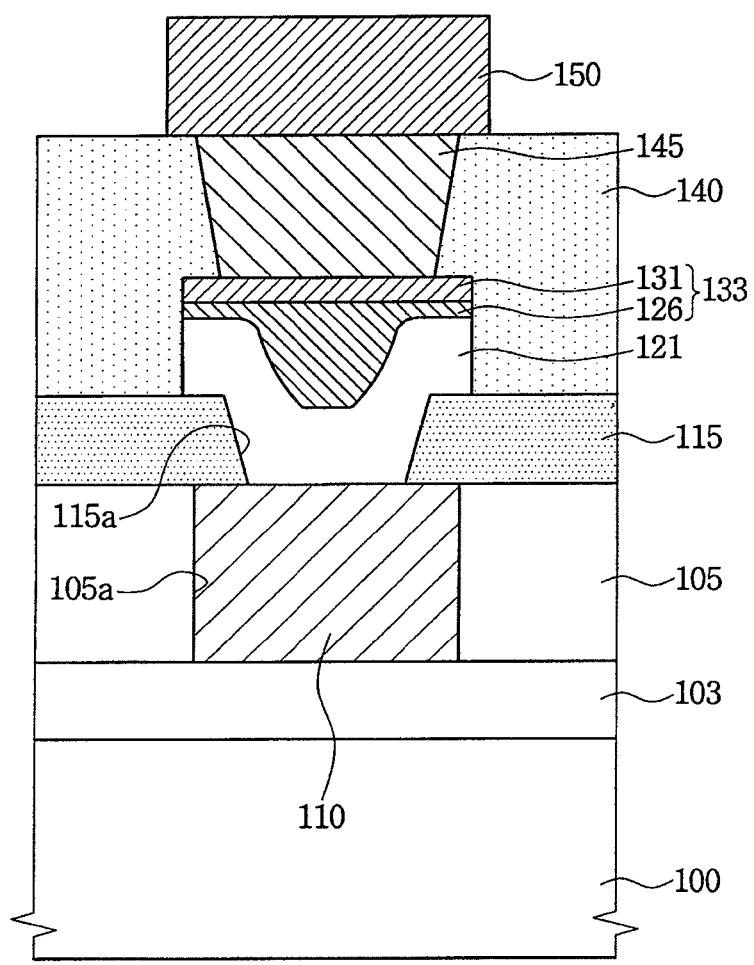
Figure 2A:
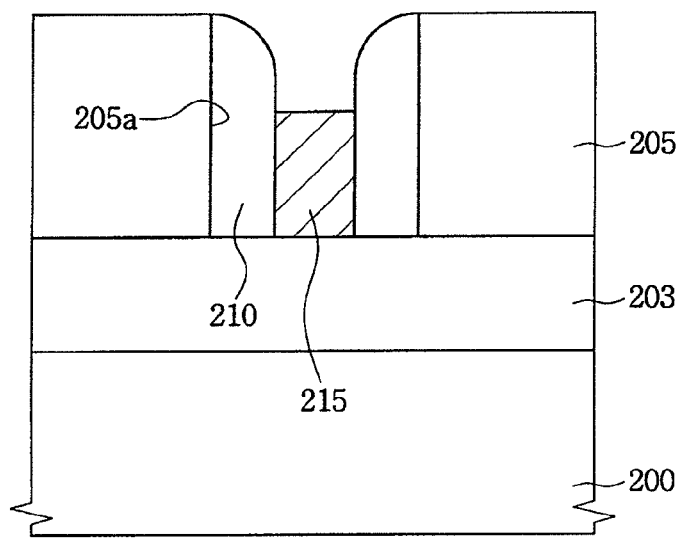
FIGS. 2A to 2D are cross-sectional views of a semiconductor device according to an exemplary embodiment of the present invention.
Figure 2B:
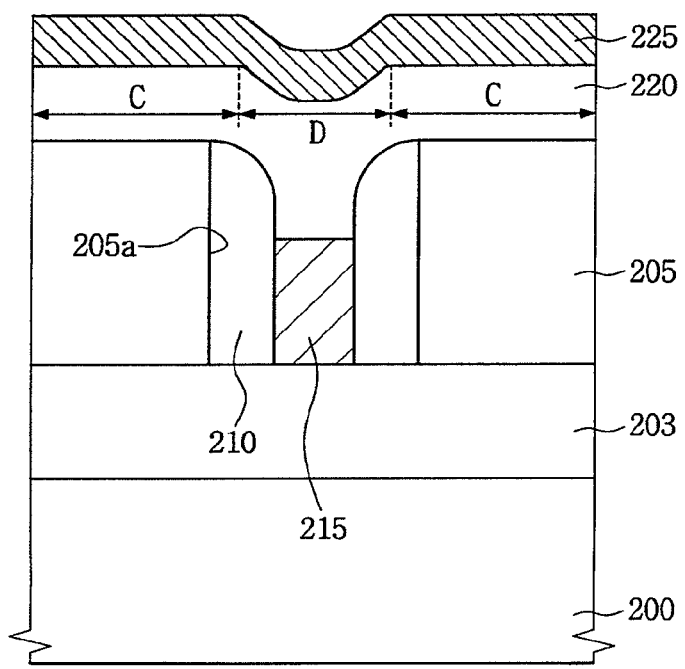
Figure 2C:
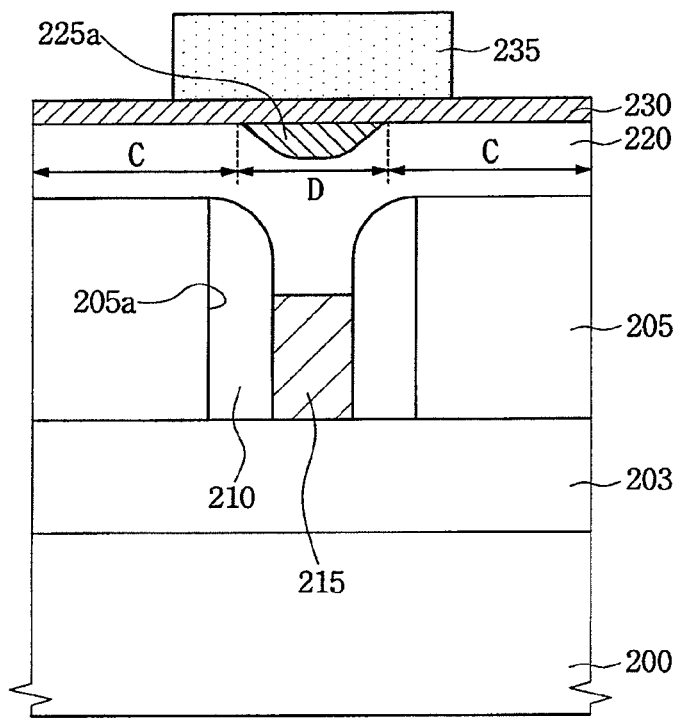
Figure 2D:
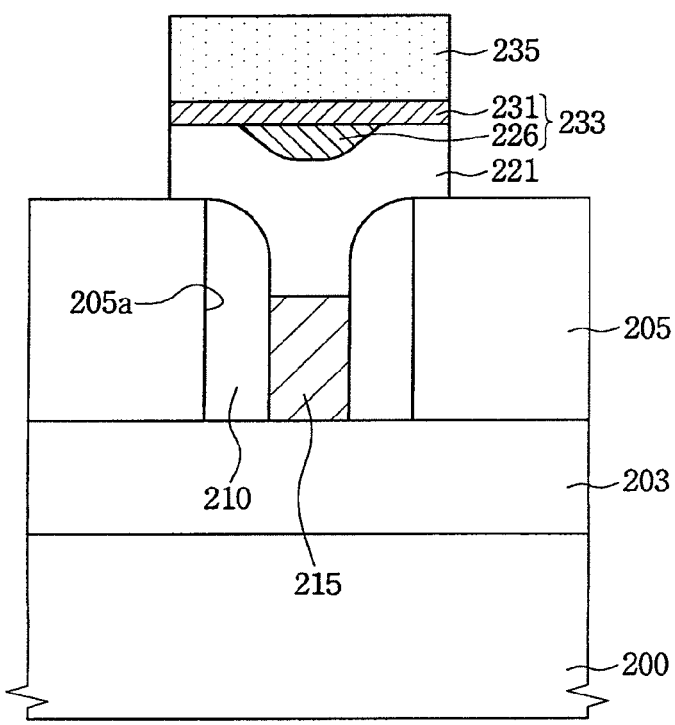
Figure 3:
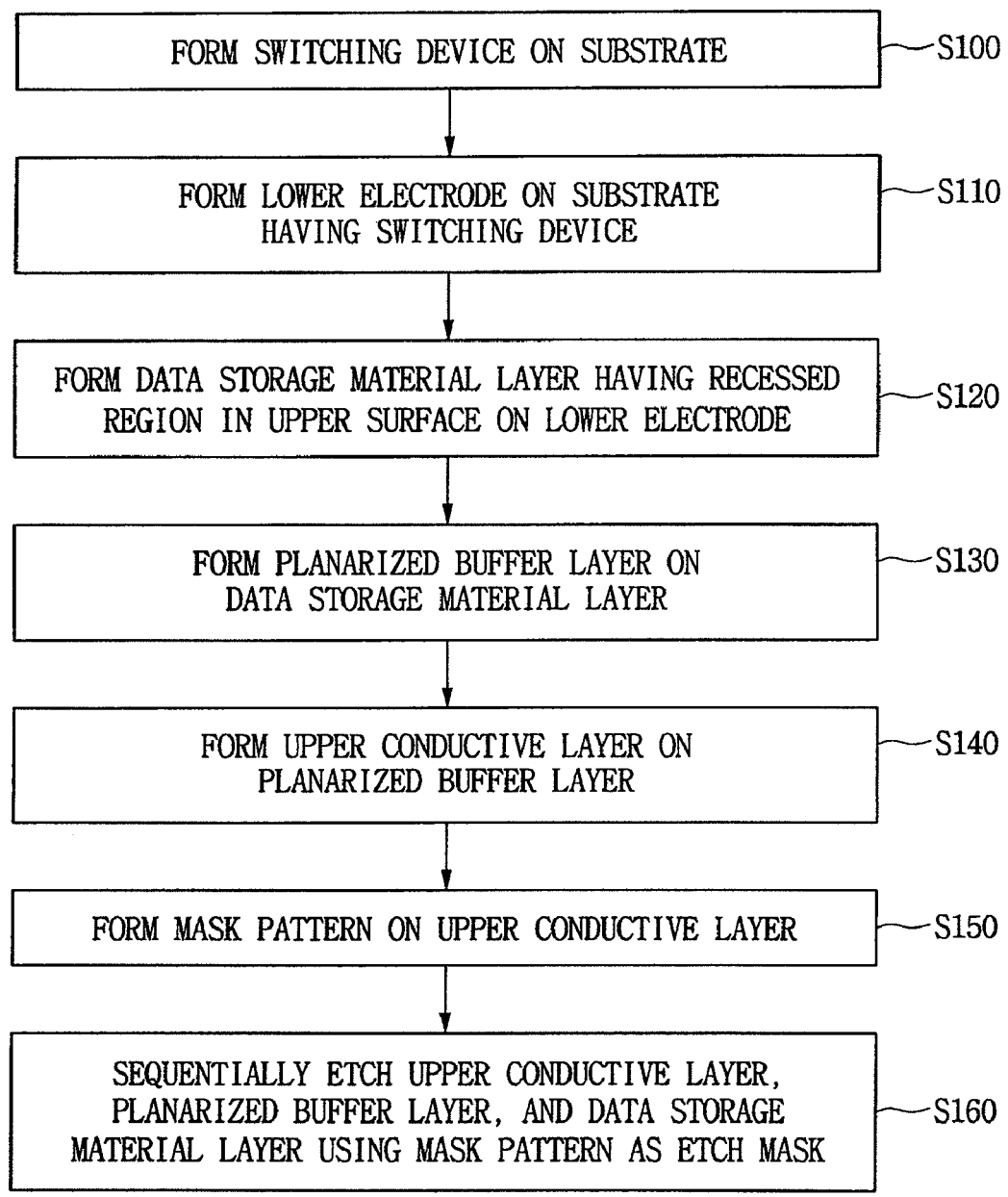
FIG. 3 is a flowchart of a method of manufacturing a semiconductor device according to an exemplary embodiment of the present invention.

FIGS. 1A to 1F are cross-sectional views of a semiconductor device according to an exemplary embodiment of the present invention, FIGS. 2A to 2D are cross-sectional views of a semiconductor device according to an exemplary embodiment of the present invention, and FIG. 3 is a flowchart of a method of manufacturing a semiconductor device according to an exemplary embodiment of the present invention.

First, a semiconductor device according to an exemplary embodiment of the present invention will be described with reference to FIG. 1F.

Referring to FIG. 1F, a semiconductor substrate 100 is provided. The semiconductor substrate 100 may include a semiconductor material such as silicon. A switching device such as a diode or transistor may be provided on the semiconductor substrate 100. A word line electrically connected to the switching device may be provided on the semiconductor substrate 100. For example, an isolation region defining an active region may be provided on the semiconductor substrate 100, metal oxide semiconductor (MOS) transistors may be provided on the active region, and a word line electrically connected to gate electrodes of the MOS transistors may be provided. Alternatively, the word line may be provided in the active region and diodes may be provided on the word line. In this configuration, an n-type semiconductor region and a p-type semiconductor region of each of the diodes may be vertically arranged.

A lower insulating layer 103 covering the switching device and the word line may be provided on the semiconductor substrate 100. An interlayer insulating layer 105 having a hole 105a may be provided on the lower insulating layer 103. A first electrode structure 110 may be provided in the hole 105a of the interlayer insulating layer 105. The first electrode structure 110 may include a first electrode having a flat bottom region and a body region projecting from an edge of the bottom region, and an internal insulating pattern surrounded by the body region of the first electrode. When viewed in a plan view, the first electrode structure 110 may include a ring-shaped first electrode. The first electrode may be defined as a lower electrode. The lower electrode may be electrically connected to the switching device by directly passing through the lower insulating layer 103 or may be electrically connected to the switching device through another conductive layer passing through the lower insulating layer 103. The lower electrode may be formed of at least one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer, and a combination thereof.

In exemplary embodiments of the present invention, the shape of the first electrode structure 110 is not limited to the ring-shaped electrode. For example, when viewed in a plan view, the first electrode structure 110 may include various other electrode shapes such as a circle shape, a line shape, etc.

A molding pattern 115 having an opening 115a partially or entirely exposing the first electrode structure 110 may be provided on the interlayer insulating layer 105. The opening 115a may have an inclined sidewall whose width gradually narrows from the top to the bottom. Alternatively, the opening 115a may have a perpendicular sidewall. When viewed in a plan view, the opening 115a may have various shapes such as a line, a circle, and a rectangle. The molding pattern 115 may be formed of an insulating material such as a silicon oxide layer or a silicon nitride layer.

A data storage pattern 121 having a recessed region in an upper surface may be provided on the first electrode structure 110. The data storage pattern 121 may have the recessed region on the first electrode structure 110. Specifically, the data storage pattern 121 may include a first region having a first upper surface disposed at a first level and a second region having a second upper surface disposed at a second level that is lower than the first level. The data storage pattern 121 may include a phase change material layer. For example, the phase change material layer may include a chalcogenide layer such as a GexSbyTez (GST) layer.

A planarized buffer pattern 126 may be provided on the data storage pattern 121. The planarized buffer pattern 126 may contain a conductive material. The planarized buffer pattern 126 may fill at least the recessed region of the data storage pattern 121.

A conductive pattern 131 may be provided on the planarized buffer pattern 126. The planarized buffer pattern 126 and the conductive pattern 131 may constitute an upper electrode 133. The data storage pattern 121 and the conductive pattern 131 may be self-aligned.

As shown in FIG. 1F, the planarized buffer pattern 126 may fill the recessed region of the data storage pattern 121. A region other than the recessed region of the data storage pattern 121 may be formed to have a predetermined thickness. Alternatively, the buffer pattern 126 may be provided to fill only the recessed region of the data storage pattern 121.

An intermetal insulating layer 140 may be provided on the substrate having the data storage pattern 121 and the upper electrode 133 that are sequentially stacked. A conductive plug 145 passing through the intermetal insulating layer 140 may be provided. A conductive line, in other words, a bit line 150, may be provided on the conductive plug 145.

The conductive plug 145, the upper electrode 133, and the data storage pattern 121 may form a stable contact. The conductive pattern 131 may be formed to have an upper surface planarized to a uniform thickness by forming the planarized buffer pattern 126 on the data storage pattern 121 having the recessed region provided in its upper surface. Accordingly, the conductive pattern 131 and the conductive plug 145 may form the stable contact.

The semiconductor device structure is not limited to the exemplary embodiment of the present invention described with reference to FIG. 1F, and thus it may be embodied in various forms. For example, instead of the data storage pattern 121, a lower pattern, which has the same shape as the data storage pattern 121 but is made of a different material, for example, a metal material, may be provided and the planarized buffer pattern 126, the conductive pattern 131, and the conductive plug 145 as described above may be provided on the lower pattern.

Next, an exemplary embodiment of the present invention will be described with reference to FIG. 2D. Referring to FIG. 2D, a semiconductor substrate 200 is provided. The semiconductor substrate 200 may include a semiconductor material such as silicon. A switching device such as a diode or transistor and a word line may be provided on the semiconductor substrate 200 as described with reference to FIG. 1F.

A lower insulating layer 203 covering the switching device and the word line may be provided on the semiconductor substrate 200. An interlayer insulating layer 205 having a hole 205a may be provided on the lower insulating layer 203. An insulating spacer 210 may be provided on a sidewall of the hole 205a of the interlayer insulating layer 205. A lower electrode 215 surrounded by the insulating spacer 210 may be provided to partially fill the hole 205a. The lower electrode 215 may be electrically connected to the switching device by directly passing through the lower insulating layer 203 or may be electrically connected to the switching device through another conductive layer passing through the lower insulating layer 203.

Like the data storage pattern 121 of FIG. 1F, a data storage pattern 221 having a recessed region in an upper surface may be provided on the lower electrode 215. The data storage pattern 221 may have the recessed region on the lower electrode 215. The data storage pattern 221 may include a phase change material layer.

A planarized buffer pattern 226 may be provided on the data storage pattern 221. The planarized buffer pattern 226 may include a conductive material layer. The planarized buffer pattern 226 may fill at least the recessed region of the data storage pattern 221.

A conductive pattern 231 may be provided on the planarized buffer pattern 226. The planarized buffer pattern 226 and the conductive pattern 231 may constitute an upper electrode 233. The data storage pattern 221 and the conductive pattern 231 may be self-aligned. Although not shown, a conductive plug 145 and a conductive line 150 as shown in FIG. 1F may be provided on the conductive pattern 231.

The planarized buffer pattern 226 may fill only the recessed region of the data storage pattern 221 as shown in FIG. 2D. Alternatively, the planarized buffer pattern 226 may cover a non-recessed region of the data storage pattern 121 as well as the recessed region thereof as shown in FIG. 1F.

The planarized buffer patterns 126 and 226 may have a non-uniform thickness in the non-recessed regions of the data storage patterns 121 and 221, respectively. However, each of the conductive patterns 131 and 231 may be formed to have a uniform thickness in a process error range. Therefore, since the conductive patterns 131 and 231 having the uniform thicknesses are formed on the planarized buffer patterns 126 and 226, which are formed on the data storage patterns 121 and 221, the conductive plug 145 may form the stable contact on the data storage patterns 121 and 221 having the recessed regions in their upper surfaces.

Next, methods of manufacturing the above-described semiconductor device structures will be described. First, a method of manufacturing the semiconductor device according to an exemplary embodiment of the present invention will be described with reference to FIGS. 1A to 1F and 3.

Referring to FIGS. 1A and 3, a semiconductor substrate 100 is prepared. The semiconductor substrate 100 may include a semiconductor material such as silicon. A switching device such as a diode or transistor may be formed on the semiconductor substrate 100 (S100). Along with the switching device, a conductive line, for example, a word line, may be formed on the semiconductor substrate 100. For example, an isolation region defining an active region may be formed on the semiconductor substrate 100, MOS transistors may be formed on the active region, and a word line electrically connected to gate electrodes of the MOS transistors may be provided. Alternatively, the word line may be formed in the active region and diodes may be formed on the word line. In this configuration, an n-type semiconductor region and a p-type semiconductor region of each of the diodes may be vertically arranged.

A lower insulating layer 103 covering the switching device and the word line may be formed on the semiconductor substrate 100. An interlayer insulating layer 105 having a hole 105a may be provided on the lower insulating layer 103. A first electrode structure 110 may be provided in the opening 105a of the interlayer insulating layer 105 (S110). The first electrode structure 110 may include a first electrode having a flat bottom region and a body region projecting from an edge of the bottom region, and an internal insulating pattern surrounded by the body region of the first electrode. When viewed in a plan view, the first electrode structure 110 may include a ring-shaped first electrode. The first electrode may be defined as a lower electrode. The lower electrode may be electrically connected to the switching device by directly passing through the lower insulating layer 103 or may be electrically connected to the switching device through another conductive layer passing through the lower insulating layer 103. The lower electrode may be formed of at least one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a Ru layer, a CoSi layer, a NiSi layer, a conductive carbon group layer, a Cu layer, and a combination thereof.

In exemplary embodiments of the present invention, the shape of the first electrode structure 110 is not limited to the ring-shaped electrode. For example, when viewed in a plan view, the first electrode structure 110 may include various other electrode shapes such as a circle shape, a line shape, etc.

A molding pattern 115 having an opening 115a partially or entirely exposing the first electrode structure 110 may be formed on the interlayer insulating layer 105. The molding pattern 115 may be formed of an insulating material such as a silicon oxide layer or a silicon nitride layer. The molding pattern 115 may include a material having an etch selectivity with respect to the interlayer insulating layer 105.

Referring to FIGS. 1B and 3, a data storage material layer 120 may be formed on the semiconductor substrate having the molding pattern 115 (S120). The data storage material layer 120 may have a recessed region B on the first electrode structure 110. Specifically, the data storage material layer 120 may include a first region A having a first upper surface formed at a first level and a second region B, in other words, the recessed region, having a second upper surface formed at a second level that is lower than the first level by a first distance t1. Here, the second region B of the data storage material layer 120 may be formed on the first electrode structure 110. The data storage material layer 120 may include a phase change material layer. For example, the phase change material layer may include a chalcogenide layer such as a GST layer.

A buffer layer 125 may be formed on the data storage material layer 120. The buffer layer 125 may be formed to fill at least the recessed region B of the data storage material layer 120. The buffer layer 125 may be formed to include a conductive material layer such as a high-melting-point metal layer or a metal nitride layer.

Referring to FIGS. 1C and 3, a planarized buffer layer 125a may be formed by planarizing the buffer layer 125 (S130). The buffer layer 125 may be planarized using chemical mechanical polishing (CMP). The recessed region of the data storage material layer 120 may be filled with the planarized buffer layer 125a.

In an exemplary embodiment of the present invention, the planarized buffer layer 125a may be formed by planarizing the buffer layer 125 such that the planarized buffer layer 125a having a predetermined thickness may remain on the first region A of the data storage material layer 120.

In an exemplary embodiment of the present invention, the planarized buffer layer 125a may be formed by planarizing the buffer layer 125 until the first region A of the data storage material layer 120 is exposed.

Referring to FIGS. 1D and 3, an upper conductive layer 130 may be formed on the planarized buffer layer 125a (S140). The upper conductive layer 130 may be formed to have a uniform thickness. The upper conductive layer 130 may be formed to include a conductive material layer such as a high-melting-point metal layer or a metal nitride layer.

A mask pattern 135 may be formed on the upper conductive layer 130 (S150). The mask pattern 135 may be formed of a material having an etch selectivity with respect to the upper conductive layer 130 and the data storage material layer 120. For example, the mask pattern 135 may be formed of a material layer such as a silicon oxide layer or a silicon nitride layer. Alternatively, the mask pattern 135 may be formed of a photoresist pattern.

Referring to FIGS. 1E and 3, the upper conductive layer (130 of FIG. 1D), the planarized buffer layer (125a of FIG. 1D), and the data storage material layer (120 of FIG. 1D) may be etched using the mask pattern 135 as an etch mask (S160). Consequently, a data storage pattern 121, a planarized buffer pattern 126, and a conductive pattern 131 that are sequentially stacked may be formed. The data storage pattern 121 and the conductive pattern 131 may be self-aligned. The conductive pattern 131 and the planarized buffer pattern 126 may constitute a second electrode, in other words, an upper electrode 133. Since the mask pattern 135 is formed on the conductive pattern 131 having a planarized upper surface, a photo process for forming the mask pattern 135 may be easy. In other words, even when the data storage pattern 121 has the recessed region in its upper surface during the photo process for forming the mask pattern 135, the planarized buffer pattern 126 and the conductive pattern 131 may prevent a photo process defect due to diffused reflection. Since the upper conductive layer (130 of FIG. 1D) is formed on the planarized buffer layer (125a of FIG. 1D), a uniform crystal structure may be formed. Consequently, since the upper conductive layer (130 of FIG. 1D) may be uniformly etched in a vertical direction while etching the upper conductive layer (130 of FIG. 1D) using the mask pattern 135 as the etch mask, the conductive pattern 131 may be formed to have a substantially vertical sidewall. Since the data storage pattern (120 of FIG. 1D) may be uniformly etched in the vertical direction, the data storage pattern 121 may be formed to have a substantially vertical sidewall. Accordingly, the data storage pattern 121 may be formed to have a uniform size throughout the semiconductor substrate 100 such as a large-diameter semiconductor wafer.

Referring to FIG. 1F, the mask pattern (135 of FIG. 1E) may be removed. On the other hand, when the mask pattern (135 of FIG. 1E) is formed of a material other than the photoresist pattern, a process of removing the mask pattern (135 of FIG. 1E) may be omitted. An intermetal insulating layer 140 may be formed on the substrate having the data storage pattern 121, the planarized buffer pattern 126, and the conductive pattern 131 that are sequentially stacked.

An opening may be formed to expose the conductive pattern 131 by patterning the intermetal insulating layer 140. One conductive pattern 131 is shown in the exemplary embodiments of the present invention, but a plurality of conductive patterns 131 may be formed on a large-diameter semiconductor wafer. Throughout the semiconductor wafer, the planarized buffer pattern 126 formed by a planarizing process may have non-uniform thickness in a region other than the recessed region. However, the conductive pattern 131 may be formed to have a uniform thickness in a process error range. Accordingly, the data storage pattern 121 may be prevented from being exposed even when the conductive pattern 121 is partially etched at a specific position of the semiconductor wafer while patterning the intermetal insulating layer 140 to form an opening exposing the conductive pattern 131.

A conductive plug 145 filling the opening of the intermetal insulating layer 140 and electrically connected to the conductive pattern 131 may be formed. Due to the planarized buffer pattern 126 formed on the data storage pattern 121 and the conductive pattern 131 having a uniform thickness, the conductive plug 145 may form a stable contact on the data storage pattern 121 having the recessed region in its upper surface.

Subsequently, a conductive line, in other words, a bit line, covering the conductive plug 145 may be formed on the intermetal insulating layer 140.

A method of manufacturing a semiconductor device according to an exemplary embodiment of the present invention is not limited to the exemplary embodiments described with reference to FIGS. 1A to 1F. For example, the method may be employed to manufacture semiconductor devices having other forms. Next, a method of manufacturing a semiconductor device according to an exemplary embodiment of the present invention will be described with reference to FIGS. 2A to 2D and 3. Referring to FIGS. 2A and 3, a switching device may be formed on a semiconductor substrate 200 (S100). The switching device may be a diode or transistor. Along with the switching device, a conductive line, for example, a word line may be formed on the semiconductor substrate 200. A lower insulating layer 203 covering the switching device and the word line may be formed on the semiconductor substrate 200. An interlayer insulating layer 205 having a hole 205a may be formed on the lower insulating layer 203. An insulating spacer 210 may be formed on a sidewall of the hole 205a.

A first electrode, in other words, a lower electrode 215 surrounded by the insulating spacer 210 may be formed in the hole 205a (S110). The lower electrode 215 may have an upper surface disposed at a lower level than the upper surface of the interlayer insulating layer 205. In other words, the lower electrode 215 may be provided to partially fill the hole 205a. The lower electrode 215 may be electrically connected to the switching device through another conductive layer passing through the lower insulating layer 203.

Referring to FIGS. 2B and 3, a data storage material layer 220 having a recessed region in an upper surface may be formed on the substrate having the lower electrode 215 (S120). Specifically, the data storage material layer 220 may include a first region C having a first upper surface disposed at a first level and a second region D, in other words, a recessed region having a second upper surface disposed at a second level that is lower than the first level. Here, the second region D of the data storage material layer 220 may be formed on the lower electrode 215. The data storage material layer 220 may include a phase change material layer. For example, the phase change material layer may include a chalcogenide layer such as a GST layer.

A buffer layer 225 may be formed on the data storage material layer 220. The buffer layer 225 may be formed to fill at least the recessed region D of the data storage material layer 220. The buffer layer 225 may be formed to include a conductive material layer such as a high-melting-point metal layer or a metal nitride layer.

Referring to FIGS. 2C and 3, a planarized buffer layer 225a may be formed by planarizing the buffer layer (225 of FIG. 2B) (S130). The buffer layer (225 of FIG. 2B) may be planarized using CMP. The recessed region of the data storage material layer 220 may be filled by the planarized buffer layer 225a. The planarized buffer layer 225a may be formed by planarizing the buffer layer (225 of FIG. 2B) until the first region C of the data storage material layer 220 is exposed. The planarized buffer layer 225a may be formed by planarizing the buffer layer (225 of FIG. 2B) such that the planarized buffer layer 225a having a predetermined thickness may remain in the first region C of the data storage material layer 220.

An upper conductive layer 230 may be formed on the substrate having the planarized buffer layer 225a (S140). The upper conductive layer 230 may be formed to have a uniform thickness. The upper conductive layer 230 may be formed to have planarized bottom and top surfaces. The upper conductive layer 230 may be formed to include a conductive material layer such as a high-melting-point metal layer or a metal nitride layer. A mask pattern 235 may be formed on the upper conductive layer 230 (S150). The mask pattern 235 may be formed of a material having an etch selectivity with respect to the upper conductive layer 230 and the data storage material layer 220. For example, the mask pattern 235 may be formed to include a material layer such as a silicon oxide layer or a silicon nitride layer. Alternatively, the mask pattern 235 may be formed of a photoresist pattern.

Referring to FIGS. 2D and 3, the upper conductive layer (230 of FIG. 2C), the planarized buffer layer (225a of FIG. 2C), and the data storage material layer (220 of FIG. 2C) may be etched using the mask pattern 235 as an etch mask (S160). On the other hand, when the planarized buffer layer (225a of FIG. 2C) is formed only under the mask pattern 235, the planarized buffer layer (225a of FIG. 2C) may remain during an etching process using the mask pattern 235 as an etch mask and thus may be defined as a planarized buffer pattern 226. Consequently, the data storage pattern 221, the buffer pattern 226, and the conductive pattern 231 that are sequentially stacked on the lower electrode 215 may be formed. The data storage pattern 221 and the conductive pattern 231 may be self-aligned. The conductive pattern 231 and the planarized buffer pattern 226 may be defined as an upper electrode. Subsequently, using substantially the same method as the method of manufacturing a semiconductor device described with reference to FIG. 1F, an intermetal insulating layer, a conductive plug passing through the intermetal insulating layer and electrically connected to the conductive pattern 231, and a bit line arranged on the conductive plug may be formed on the substrate having the conductive pattern 231.

According to exemplary embodiments of the present invention, a planarized buffer pattern, a conductive pattern having a uniform thickness, and a conductive plug may be sequentially stacked on a predetermined pattern having a recessed region in an upper surface. The planarized buffer pattern, the conductive pattern having a uniform thickness, and the conductive plug that are sequentially stacked on the predetermined pattern having the recessed region in its upper surface can form a stable contact structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A contact structure, comprising:
a first pattern formed on a substrate, wherein the first pattern has a recessed region in an upper surface thereof;
a planarized buffer pattern formed on the first pattern;
a conductive pattern formed on the planarized buffer pattern, wherein the conductive pattern has a substantially uniform thickness across an entire surface of the planarized buffer pattern;
an insulating layer formed on the conductive pattern;
a conductive plug passing through the insulating layer; and
a conductive line formed on the insulating layer and the conductive plug,
wherein the conductive plug is electrically connected to the conductive pattern and the conductive line.

2. The contact structure of claim 1, wherein the planarized buffer pattern includes a conductive material.

3. The contact structure of claim 1, wherein the recessed region of the first pattern is filled with the planarized buffer pattern.

4. The contact structure of claim 1, wherein the conductive pattern is self-aligned with the first pattern.

5. A semiconductor device, comprising:
a data storage pattern formed on a substrate, wherein the data storage pattern has a recessed region in an upper surface thereof;
a planarized buffer pattern formed on the data storage pattern;
a conductive pattern formed on the planarized buffer pattern;
an intermetal insulating layer formed on the conductive pattern;
a conductive plug passing through the intermetal insulating layer; and
a conductive line formed on the intermetal insulating layer and the conductive plug,
wherein the conductive plug is electrically connected to the conductive pattern and the conductive line.

6. The semiconductor device of claim 5, wherein the data storage pattern includes a phase change material.

7. The semiconductor device of claim 5, wherein the recessed region of the data storage pattern is filled with the planarized buffer pattern.

8. The semiconductor device of claim 5, wherein the planarized buffer pattern includes a conductive material.

9. The semiconductor device of claim 5, wherein the data storage pattern and the conductive pattern are self-aligned.

10. The semiconductor device of claim 5, further comprising:
an interlayer insulating layer provided between the data storage pattern and the substrate, wherein the interlayer insulating layer has a hole; and
a lower electrode formed in the hole.

11. The semiconductor device of claim 10, further comprising:
a molding pattern formed between the data storage pattern and the interlayer insulating layer,
wherein the data storage pattern has a part passing through the molding pattern and electrically connected to the lower electrode.

12. The semiconductor device of claim 5, wherein the conductive pattern has a substantially uniform thickness across an entire surface of the planarized buffer pattern.

13. The semiconductor device of claim 5, wherein the planarized buffer pattern and the conductive pattern form an upper electrode.

* * * * *